(12) United States Patent
Yoshihiro et al.

(10) Patent No.: US 6,475,314 B1
(45) Date of Patent: Nov. 5, 2002

(54) ADHESIVE LAMINATION USEFUL IN MAKING CIRCUIT BOARD STRUCTURES

(75) Inventors: Shirai Yoshihiro, Yamatokoriyama (JP); Tani Shinichi, Yamatokoriyama (JP)

(73) Assignee: Sharp Kabushiki Kaisha, Osaka (JP)

( * ) Notice: This patent issued on a continued prosecution application filed under 37 CFR 1.53(d), and is subject to the twenty year patent term provisions of 35 U.S.C. 154(a)(2).

Subject to any disclaimer, the term of this patent is extended or adjusted under 35 U.S.C. 154(b) by 0 days.

(21) Appl. No.: 08/740,645

(22) Filed: Oct. 31, 1996

(30) Foreign Application Priority Data

Nov. 17, 1995 (JP) ............................... 7-299806
Feb. 27, 1996 (JP) ............................... 8-039779

(51) Int. Cl.$^7$ ................................ B32B 7/14
(52) U.S. Cl. .................... 156/41.8; 428/41.7; 428/41.9; 428/101; 428/202; 428/901; 156/230; 156/249; 156/290; 156/297; 156/300; 156/301; 345/87
(58) Field of Search ............................... 428/41.8, 41.7, 428/41.9, 101, 202, 901; 156/290, 300, 230, 297, 249, 301; 345/87

(56) References Cited

U.S. PATENT DOCUMENTS 4,959,008 A * 9/1990 Wasulko .................... 428/40.7
5,724,056 A * 3/1998 Kato ............................ 345/87

FOREIGN PATENT DOCUMENTS

| JP | 4183767 | 6/1992 |
| JP | 772493 | 1/1995 |
| JP | 757802 | 3/1995 |
| JP | 7261192 | 10/1995 |

* cited by examiner

Primary Examiner—Linda Gray
(74) Attorney, Agent, or Firm—Dike, Bronstein, Roberts & Cushman; David G. Conlin

(57) ABSTRACT

An adhesive lamination has patches of an adhesive layer which correspond to predetermined positions on a plurality of circuit boards, and the adhesive layer is applied across the plurality of circuit boards. This adhesive lamination is composed of a first separation sheet, a second separation sheet and the adhesive layer interposed between the first and second separation sheets. A number of patches of the adhesive layer are formed on the first separation sheet and arranged so that the length of the patch of the adhesive layer is approximately parallel to the short side of the first separation sheet.

12 Claims, 15 Drawing Sheets

ADHESIVE LAMINATION USEFUL IN MAKING CIRCUIT BOARD STRUCTURES

BACKGROUND OF THE INVENTION

(1) Field of the Invention

The present invention is directed to the field of manufacturing display devices such as liquid crystal display devices, EL display devices and the like. The invention relates to a production method for an adhesive lamination for adhering films (such as TAB films), at least having electrodes, to elongated circuit boards, a production method for a circuit board using the adhesive lamination as well as relating to a display device using the circuit board and a production method for the display device.

(2) Description of the Prior Art

Conventional liquid crystal display (LCD) devices are formed of an LCD panel having a multiple number of TAB films electrically connected thereto and some elongated circuit boards electrically connected to these multiple number of TAB films.

The method of electrically connecting these multiple number of TAB films to the elongated circuit board is briefly described below.

First, in order to position a multiple number of TAB films to the elongated circuit board at predetermined positions, a strip of adhesive tape which is composed of a separation sheet and an adhesive layer and is wound up as in a reel, is cut into the length which extends across a plurality of TAB films provided on one side of the LCD panel, and the thus cut adhesive tape is applied directly on one elongated circuit board in parallel therewith.

Then, the separation sheet is removed to expose the adhesive layer, and the plural TAB films jointed to the LCD panel are positioned relative to the circuit board so that the electrode terminals on both sides correspond to each other. In this arrangement, the TAB films are laid over the circuit board and pressed on the area with the adhesive layer against the circuit board so that the TAB films are adhered and fixed onto the circuit board.

Thereafter, the electrode terminals of TAB films are electrically joined with solder to those of the circuit board.

Recently, a proposal has been made in which the frame of the display window for the LCD device is made narrower to improve the effective area of the display. However, in the above conventional art, it was impossible to make the width of the circuit board narrower.

Illustratively, in the proposed configuration, it is necessary to provide a number of electronic parts such as capacitors, buffer ICs, operational amplifiers, densely and compactly on the circuit board. It is also necessary to provide holes for screws which fix the circuit board to the plastic chassis, or to form cutouts for the fixture of the LCD panel to the plastic chassis by engaging bezel claws. However, the above prior art configuration suffered from problems in that the adhesive layer tended to rise up from the surface of the board near the electronic parts or the adhesive layer blocked the holes for screws, and cutouts. Therefore, it became impossible to apply the tape with an adhesive layer, onto the circuit board without modification.

In order to solve the problems, there is a method of providing a TAB film onto the circuit board without making a plurality of adhesive patches corresponding to the electrode terminal portions of the TAB films.

However, since in this method, plural adhesive patches were sporadically distributed without corresponding to the positions of electrode terminal portions of the TAB films, when the electrode terminals of the TAB films were soldered to those of the circuit board, the film terminals near areas with no adhesive layer tended to rise up so that soldering failure was likely to occur.

Even in the case where the soldering was performed well, since the uniting strength was weak in the areas where no adhesive layer was provided, TAB films tended to separate or the soldering tended to become disconnected due to tensile stress which could occur during assembly of the LCD device.

Further, since the adhesive layer was formed patch by patch on the circuit board, the efficiency of the assembly was low, thus raising the cost.

SUMMARY OF THE INVENTION

The present invention has been achieved in view of the above problems, and it is therefore an object of the present invention to provide an adhesive lamination which is composed of a number of patches of an adhesive layer and is applied across a plurality of circuit boards by making the patches corresponding to predetermined positions on the circuit boards, thus making it possible to reduce the cost and improving the efficiency of the operation of applying the adhesive layer to the circuit board, as well as improving the reliability of electrical connection between TAB films and the circuit boards.

It is another object of the invention to provide a production method for a circuit board which by using the adhesive lamination, makes it possible to produce a circuit board with an adhesive layer attached thereon, at high work efficiency at low cost.

It is a further object of the invention to provide a liquid crystal display device and a production method therefore wherein it is possible to make the frame of the display window narrower and compact and improve the reliability of electrical connection by using the above circuit board with an adhesive layer attached thereon.

It is a still another object of the invention to provide a production method for a liquid crystal display device which is excellent in the work efficiency and enables the production of inexpensive liquid crystal display devices by forming an anisotropically conductive adhesive layer of a circuit board chain.

In order to attain the above object, the present invention includes the following configurations and devices.

In accordance with the first aspect of the invention, an adhesive lamination comprises patches of an adhesive layer which correspond to predetermined positions on a plurality of circuit boards, and is configured so that the adhesive layer is applied across the plurality of circuit boards.

In accordance with the second aspect of the invention, an adhesive lamination having the first feature, further comprises: a first separation sheet off an elongated rectangle; and a second separation sheet, and is characterized in that the patches of an adhesive layer are of an elongated rectangle, formed between the first and second separation sheets and are arranged on the first separation sheet so that the length of thee patch of the adhesive layer is approximately parallel to the short side of the first separation sheet.

In accordance with the third aspect of the invention, an adhesive lamination having the second feature is characterized in that the adhering strength between the first separation sheet and the adhesive layer is greater than that between the second separation sheet and the adhesive layer.

In accordance with the fourth aspect of the invention, an adhesive lamination having the second or third feature is characterized in that a plurality of the first separation sheets are provided on the second separation sheet, and the first separation sheets are repeatedly laid out or arranged facing one another.

In accordance with the fifth aspect of the invention, an adhesive lamination having the second or third feature is characterized in that a plurality of the first separation sheets are provided on the second separation sheet, and each of the first separation sheets is shaped in a comb-like form so that a pair of the first separation sheets are laid out mated to one another.

In accordance with the sixth aspect of the invention, an adhesive lamination having the second or third feature is characterized in that the patches of the adhesive layer formed on the first separation sheet are arranged at intervals corresponding to that of the circuit boards arranged in the circuit board chain which is formed of a series of circuit boards.

In accordance with the seventh aspect of the invention, an adhesive lamination having the second or third feature is characterized in that the adhesive layer is formed so that each film, at least having electrodes, corresponds to one patch of the adhesive layer.

In accordance with the eighth aspect of the invention, an adhesive lamination having the second or third feature is characterized in that the length of the patch of the adhesive layer is approximately equal to the length of the electrode terminal portion formed on the film, at least having electrodes.

In accordance with the ninth aspect of the invention, an adhesive lamination having the seventh feature is characterized in that the length of the patch of the adhesive layer is approximately equal to the length of the electrode terminal portion formed on the film, at least having electrodes.

In accordance with the tenth aspect of the invention, a production method for a circuit board having an adhesive layer, comprises the steps of:

forming patches of the adhesive layer which correspond to predetermined positions across a plurality of the circuit boards arranged in a circuit board chain which is formed of a series of the circuit boards; and breaking the circuit board chain with the adhesive layer attached thereon, into separated pieces of circuit boards.

In accordance with the eleventh aspect of the invention, an LCD device comprises: a plurality of films which, at least have electrodes and are connected with an LCD panel; and a circuit board, the films being adhered and fixed to the circuit board with an adhesive layer, and the electrode terminals of the film, at least having electrodes, are electrically connected to the electrode terminals of the circuit board, and is characterized in that a plurality of patches of the adhesive layer are formed corresponding to predetermined positions across a series of the circuit boards.

In accordance with the twelfth aspect of the invention, a production method for an LCD device of electrically connecting a plurality of films, at least having electrodes, and connected with an LCD panel, to a circuit board, comprises the steps of:

forming patches of an adhesive layer which correspond to predetermined positions across a plurality of circuit boards arranged in a circuit board chain which is formed of a series of circuit boards;

breaking the circuit board chain with the adhesive layer attached thereon, into separated pieces of circuit boards;

adhering and fixing the films, at least having electrodes, to the circuit board with an adhesive layer attached thereon, via the adhesive layer; and electrically connecting the films, at least having electrodes, to the circuit board by joining the electrode terminals on both sides with solder.

In accordance with the thirteen aspect of the invention, a production method for an LCD device of electrically connecting a plurality of films, at least having electrodes, and connected with an LCD panel, to a circuit board, comprises the steps of:

forming patches of the adhesive layer which correspond to predetermined positions across a plurality of circuit boards arranged in a circuit board chain which is formed of a series of circuit boards;

breaking the circuit board chain with the adhesive layer attached thereon, into separated pieces of circuit boards;

forming an anisotropically conductive adhesive layer on the circuit board chain with the adhesive layer attached thereon;

adhering and fixing the films, at least having electrodes, to the circuit board with the adhesive layer and the anisotropically conductive adhesive layer attached thereon, via the adhesive layer; and electrically connecting the films, at least having electrodes, to the circuit board by pressing and heating the anisotropically conductive adhesive layer.

In accordance with the fourteenth aspect of the invention, a production method for an LCD device of electrically connecting a plurality of films, at least having electrodes, and connected with an LCD panel, to a circuit board, comprises the steps of:

forming an anisotropically conductive adhesive layer on a circuit board chain which is formed of a series of the circuit boards;

forming patches of an adhesive layer which correspond to predetermined positions across a plurality of circuit boards arranged in the circuit board chain with the anisotropically conductive adhesive layer attached thereon;

breaking the circuit board chain with the anisotropically conductive layer and the adhesive layer attached thereon, into separated pieces of circuit boards;

adhering and fixing the films, at least having electrodes, to the circuit board with the adhesive layer and the anisotropically conductive adhesive layer attached thereon, via the adhesive layer; and electrically connecting the films, at least having electrodes, to the circuit board by pressing and heating the anisotropically conductive adhesive layer.

The effects of the invention will be described hereinbelow.

In accordance with an adhesive lamination of the invention, the patches of adhesive layer which correspond to predetermined positions of plural circuit boards are provided so that the adhesive layer can be applied across the plural circuit boards. Thus, it becomes possible to perform multiple production of circuit boards with an adhesive layer, therefore it is possible to produce the circuit boards with an adhesive layer at low cost.

Further, an adhesive lamination of the invention is composed of an elongated, rectangular first separation sheet, a second separation sheet and an elongated, rectangular adhesive layer between the first separation sheet and second separation sheet. The first separation sheet is formed with a plurality of patches of the adhesive layer so that the length of each patch of the adhesive layer is arranged approximately parallel to the short side of the first separation sheet. This arrangement facilitates easy attachment of the adhesive layer onto the circuit board chain and easy separation of the first separation sheet which is adhered to adhesive layer.

In an adhesive lamination of the invention, since the adhering strength between the first separation sheet and the adhesive layer is greater than that between the second separation sheet and the adhesive layer, the second separation sheet can first be removed from the adhesive lamination and then the remaining lamination is pressed with the adhesive layer facedown against the circuit board, thereafter the first separation sheet can be easily removed from the adhesive layer.

In an adhesive lamination of the invention, since a plurality of the first separation sheets are formed on the second separation sheet and the layout of the first separation sheets is repeated or arranged facing each other, it is possible to form many patches of adhesive layer on one adhesive lamination.

In an adhesive lamination of the invention, a plurality of the first separation sheets are formed on the second separation sheet and are shaped in a comb-like form so that a pair of the first separation sheets are laid out mated to one another. Thus, it is possible to reduce the waste of space and increase the number of the first separation sheets for each second separation sheet compared to cases where other shapes are used.

In an adhesive lamination of the invention, since the patches of the adhesive layer formed on the first separation sheet are arranged at intervals corresponding to that of the circuit boards arranged in the circuit board chain which is formed of a series of circuit boards, this feature facilitates easy application of the adhesives layer to the circuit board chain and easy removal of the first separation sheet from the adhesive layer.

In an adhesive lamination of the invention, since the adhesive layer is formed so that each film, at least having electrodes, corresponds to one patch of the adhesive layer, it is possible to keep an uniform distanced between the electrode terminals of the film, at least having electrode, and the corresponding electrode terminals of the circuit board. Thus, it is possible to easily perform the operation for electrical connection by soldering and/or with an anisotropically conductive adhesive as well as to prevent the occurrence of electrical connection defects.

In an adhesive lamination of the invention, since the length of the patch of the adhesive layer is approximately equal to the length of the electrode terminal portion formed on the film, at least having electrodes, stress loads which arise at the electrical contact points between the electrode terminals of the film, at least having electrodes, and the electrode terminals of the circuit board when the portion is tensioned, become substantially even for each contact point between the electrode terminals. Consequently, it is possible to prevent the occurrence of electrical connection defects such as disconnection due to stress loads etc. during the manufacture of the LCD devices.

The production method for a circuit board of the invention is the one for producing the circuit board having an adhesive layer and includes the steps of forming patches of the adhesive layer which correspond to predetermined positions across a plurality of circuit boards arranged in a circuit board chain which is formed of a series of the circuit boards; and breaking the circuit board chain with the adhesive layer attached thereon, into separated pieces of circuit boards. Therefore, it is possible to improve the efficiency of the operation of forming an adhesive layer onto the circuit boards and thus reduce the cost for the manufacture. For example, when the circuit boards are of a narrow width, since it is possible to take many circuit boards from one circuit board chain, the number of circuit boards in the circuit board chain becomes greater than that of patches of the adhesive layer formed on one circuit board. Therefore, this method is very effective for improvement of the work efficiency compared to the case where the adhesive layer is formed after the circuit board chain was made into separated pieces.

In accordance with an LCD device of the invention, a plurality of films, at least having electrodes, and connected with an LCD panel is adhered and fixed to a circuit board with an adhesive layer, and the electrode terminals of the film, at least having electrodes, are electrically connected to the electrode terminals of the circuit board. In such an LCD device, a number of patches of the adhesive layer are formed corresponding to predetermined positions across a series of circuit boards. Therefore, it is possible to improve the efficiency of the operation of forming an adhesive layer onto the circuit boards and thus reduce the cost for the manufacture. Further, it is easily possible to reduce the width of the frame of the display window of the LCD device and improve the reliability of the electrical connection.

A production method for an LCD device of the invention is of electrically connecting a plurality of films, at least having electrodes, and connected with an LCD panel, to a circuit board, and includes the steps of forming patches of an adhesive layer which correspond to predetermined positions across a plurality of circuit boards arranged in a circuit board chain which is formed of a series of circuit boards; breaking the circuit board chain with the adhesive layer attached thereon, into separated pieces of circuit boards; adhering and fixing the films, at least having electrodes, to the circuit board with an adhesive layer via the adhesive layer; and electrically connecting the films, at least having electrodes, to the circuit board by joining at the electrode terminals on both sides with solder. Therefore, it is easily possible to reduce the width of the frame of the display window of the LCD device and improve the reliability of the electrical connection.

Another production method for an LCD device of the invention is the one for electrically connecting a plurality of films, at least having electrodes, and connected with an LCD panel, to a circuit board, and includes the steps of forming patches of the adhesive layer which correspond to predetermined positions across a plurality of circuit boards arranged in a circuit board chain which is formed of a series of circuit boards; breaking the circuit board chain with the adhesive layer attached thereon, into separated pieces of circuit boards; forming an anisotropically conductive adhesive layer on the circuit board chain with the adhesive layer attached thereon; adhering and fixing the films, at least having electrodes, to the circuit board with the adhesive layer and the anisotropically conductive adhesive layer attached thereon via the adhesive layer; and electrically connecting the films, at least having electrodes, to the circuit board by pressing and heating the anisotropically conductive adhesive layer. Therefore, it is easily possible to reduce the width of the frame of the display window of the LCD device and improve the reliability of the electrical connection.

A further production method for an LCD device of the invention is the one for electrically connecting a plurality of films, at least having electrodes, and connected with an LCD panel, with a circuit board, and includes the steps of forming an anisotropically conductive adhesive layer on a circuit board chain which is formed of a series of the circuit boards; forming patches of an adhesive layer which correspond to predetermined positions across a plurality of circuit boards arranged in the circuit board chain with the anisotropically conductive adhesive layer attached thereon; breaking the circuit board chain with the anisotropically conductive layer and the adhesive layer attached thereon, into separated pieces of circuit boards; adhering and fixing the films, at least having electrodes, to the circuit board with the adhesive layer and the anisotropically conductive adhesive layer attached thereon, via the adhesive layer; and electrically connecting the films, at least having electrodes, to the circuit board by pressing and heating the anisotropically conductive adhesive layer. In this way, it becomes possible to effectively form an anisotropically conductive adhesive layer and an adhesive layer. Also, it is easily possible to reduce the width of the frame of the display window of the LCD device and improve the reliability of the electrical connection.

DESCRIPTION OF THE PREFERRED EMBODIMENTS

Figure 1:
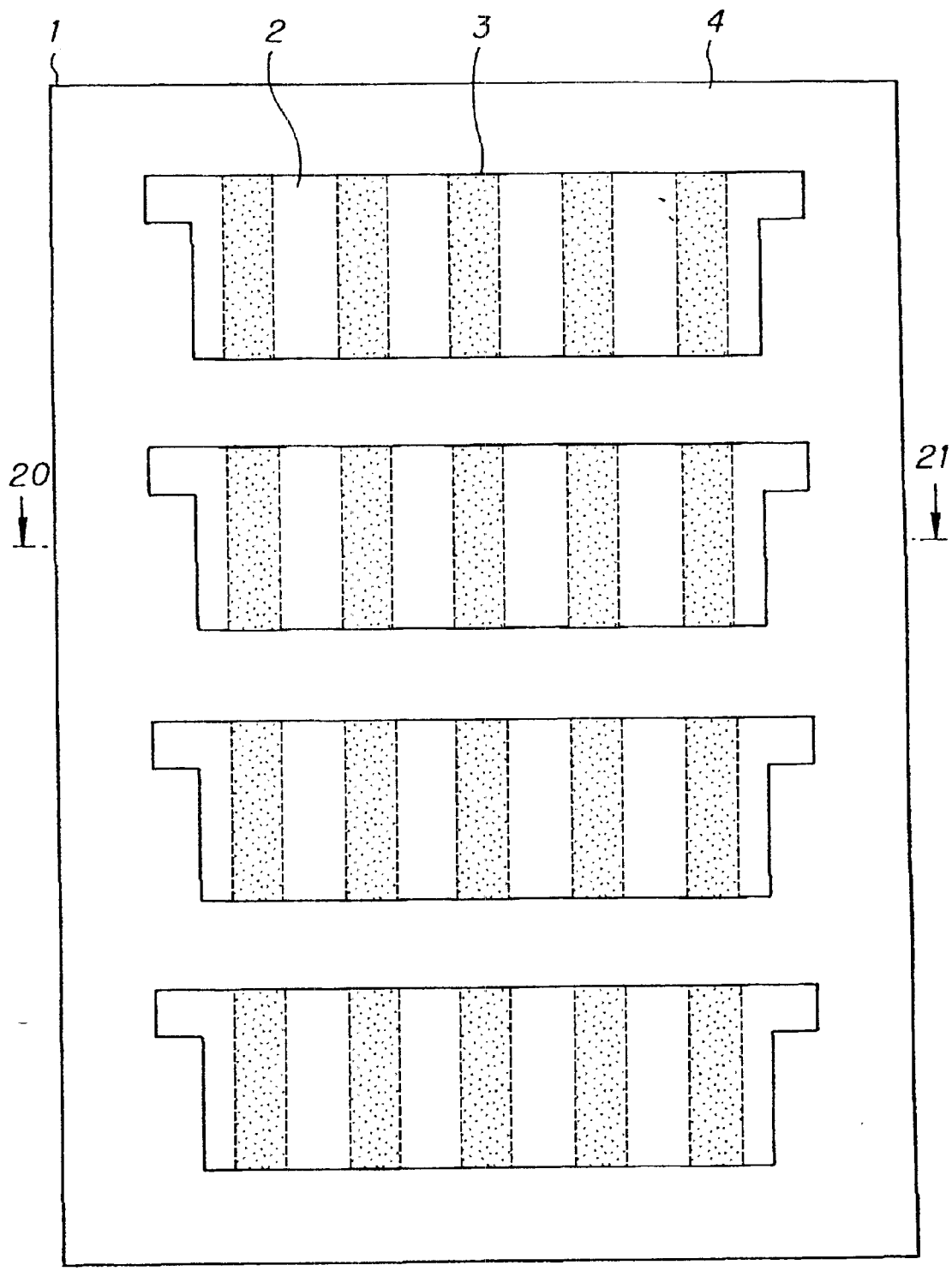
FIG. 1 is a plan view showing the first example of an adhesive lamination of the invention.

The present invention will hereinafter be described in detail with reference to the embodiment shown in the drawings.

Figure 2:
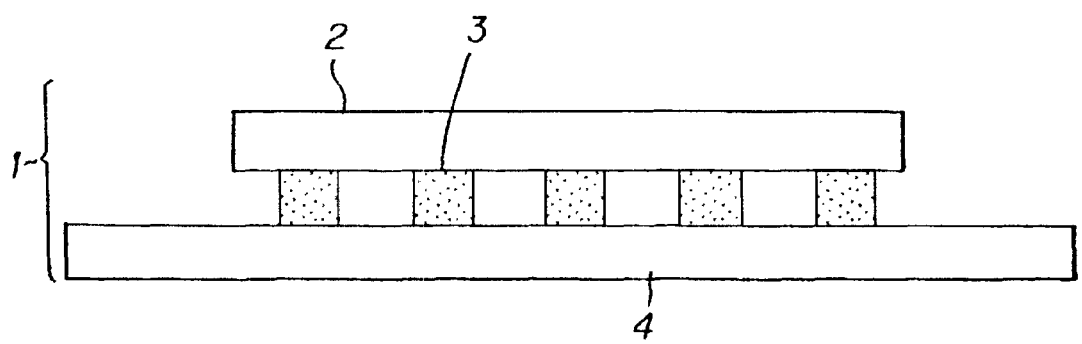
FIG. 2 is a sectional view taken on line 20–21 in FIG. 1.
Figure 3:
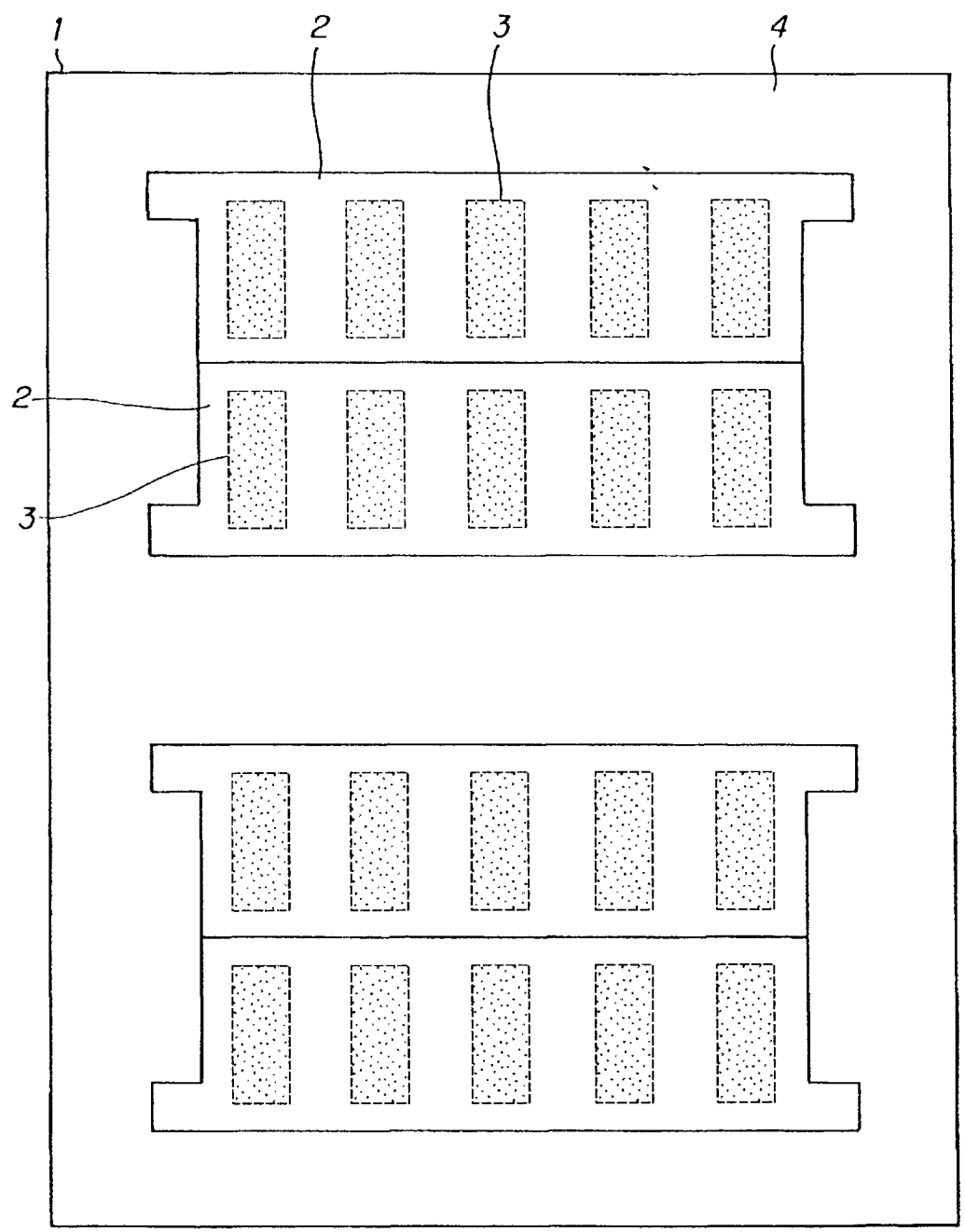
FIG. 3 is a plan view showing the second example of an adhesive lamination of the invention.
Figure 4:
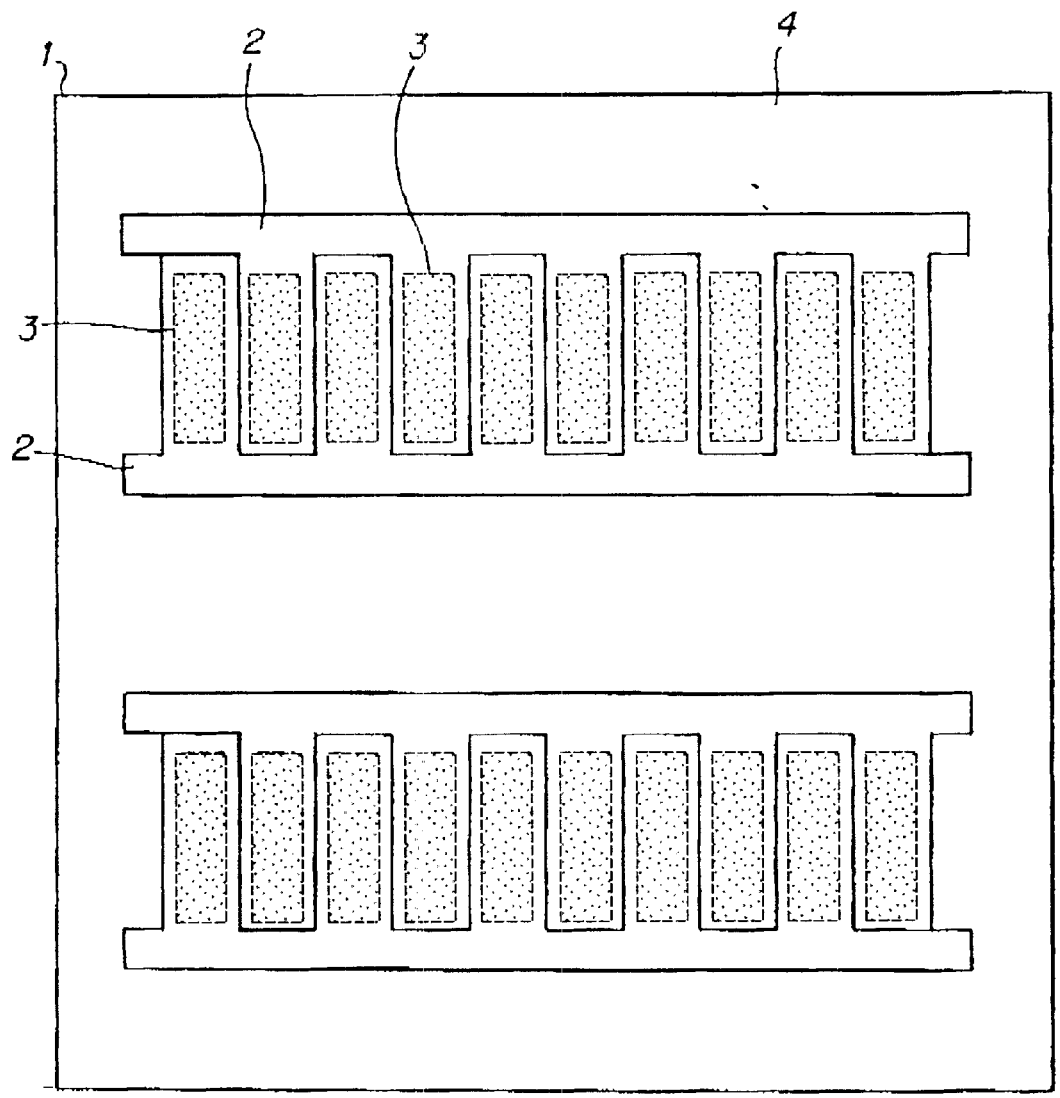
FIG. 4 is a plan view showing the third example of an adhesive lamination of the invention.
Figure 5:
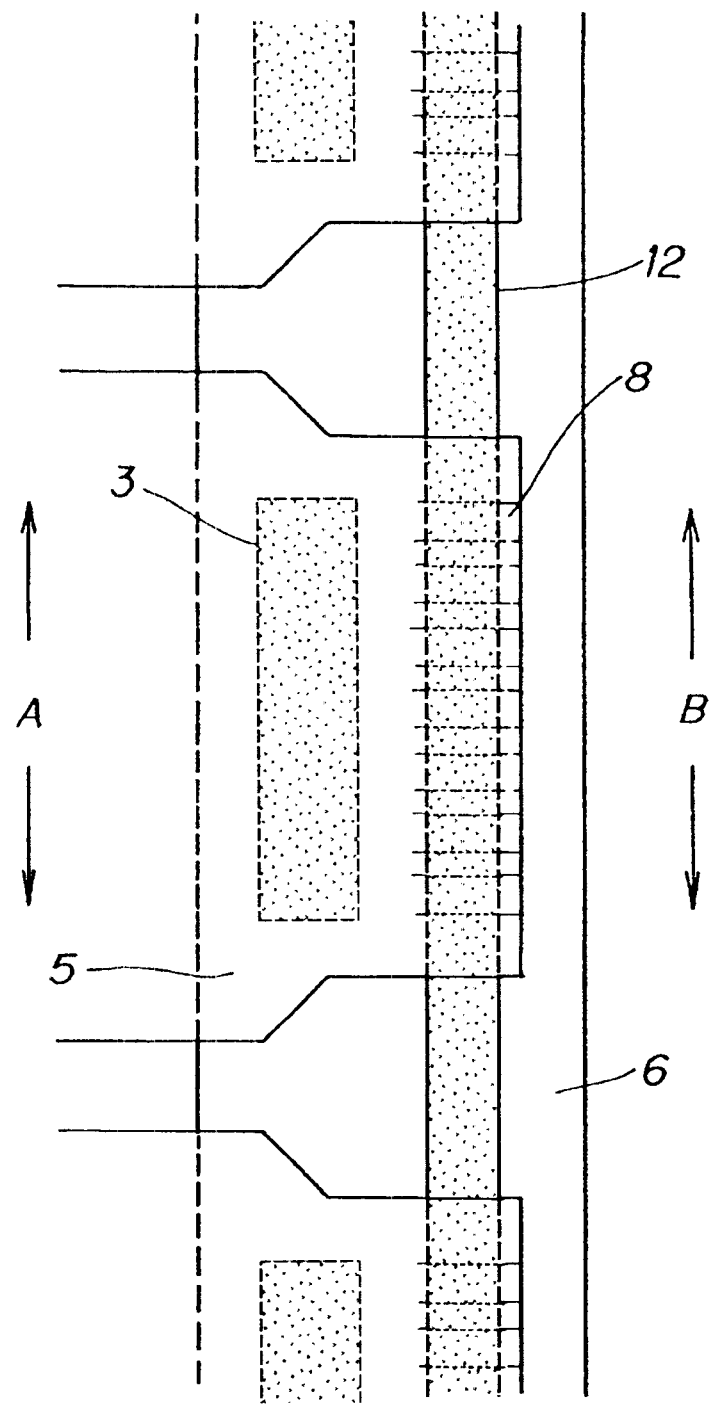
FIG. 5 is a view for illustrating the condition of the connection between constituent parts when an adhesive lamination of the invention is applied to the assembly of an LCD device.

The configuration of an adhesive lamination 1 of the invention will be described in detail with reference to FIGS. 1 through 5. FIG. 1 is a plan view showing the first example of adhesive lamination 1 of the invention. FIG. 2 is a sectional view of FIG. 1 taken on line 20–21. FIG. 3 is a plan view showing the second example of adhesive lamination 1 of the invention. FIG. 4 is a plan view showing the third example of adhesive lamination 1 of the invention. FIG. 5 is a view for illustrating the condition of the connection between constituent parts when adhesive lamination 1 of the invention is applied to the assembly of an LCD device.

As shown in FIGS. 1 and 2, adhesive lamination 1 of the invention is composed of three laminated layers: a first separation sheet 2 consisting of a polyester, film which was surface treated with transparent silicone; a colored adhesive layer 3; a second separation sheet s4 consisting of a sheet which was surface treated with oblique silicone.

First separation sheet 2 is of approximately rectangular shape having projections on its short sides so as to be picked up by hand when first separation sheet 2 is separated from adhesive layer 3.

Adhesive layer 3 between first and second separation sheets 2 and 4, is composed of three layers: a silicone adhesive, a polyester base, and an acrylic adhesive in this order from the first separation sheet 2 side, and patches of the adhesive layer are arranged in the same number at intervals corresponding to that of the circuit boards arranged in a circuit board chain which is formed of a series of circuit boards. Each patch of adhesive layer 3 is arranged so that its length is approximately parallel with the short side of the first separation sheet 2.

In adhesive lamination 1, first separation sheet 2 on which a plurality of patches (equal to the number of circuit boards in the circuit board chain, five patches in this embodiment) of adhesive layer 3 are adhered, is arranged in a plurality of rows (four rows in this embodiment) on one second separation sheet 4.

In this embodiment, although first separation sheets 2 are arranged in a simply repetitive manner as shown in FIG. 1, the following arrangements other than this can be made.

Adhesive lamination 1 shown in FIG. 3 has the three-layered configuration of the same sectional structure as in FIG. 1, but the arrangement of first separation sheets 2 on second separation sheet 4 is different; a pair of first separation sheets 2 are arranged facing each other and this pair of first separation sheets 2 is repetitively arranged.

Adhesive lamination 1 shown in FIG. 4 has the three-layered configuration as above, but the arrangement of first separation sheets 2 on second separation sheet 4 is different; first separation sheets 2 are shaped in a comb-like form and a pair of them is arranged mated to each other. This pair of first separation sheets 2 is repetitively arranged.

By the above arrangement methods, it is possible to form as many patches of adhesive layer 3 on a sheet of adhesive lamination 1 as possible.

As shown in FIG. 5, the conditions of the connection between adhesive layer 3 and film 5 (TAB film, in this embodiment), at least having electrodes, are that one patch of adhesive layer 3 is attached to each TAB film 5, and length A of this patch of adhesive layer 3 is equal to the width (the dimension of the short side) of the first separation sheet 2 or less and is approximately equal to length B of the electrode terminal portion of TAB film 5. Here, length B of the electrode terminal portion indicates the distance between the electrode terminals at both extremes in the electrode terminal portion.

In this way, adhesive layer 3 is formed corresponding to the layout and size of electrode terminals, so that the electrode terminals of TAB film 5 and those of circuit board 6 fit to one another with a uniform gap or uniform strain. This facilitates the electrical connection between TAB film 5 and circuit board 6, making it possible to prevent the occurrence of electrical connection defects.

Figure 6:
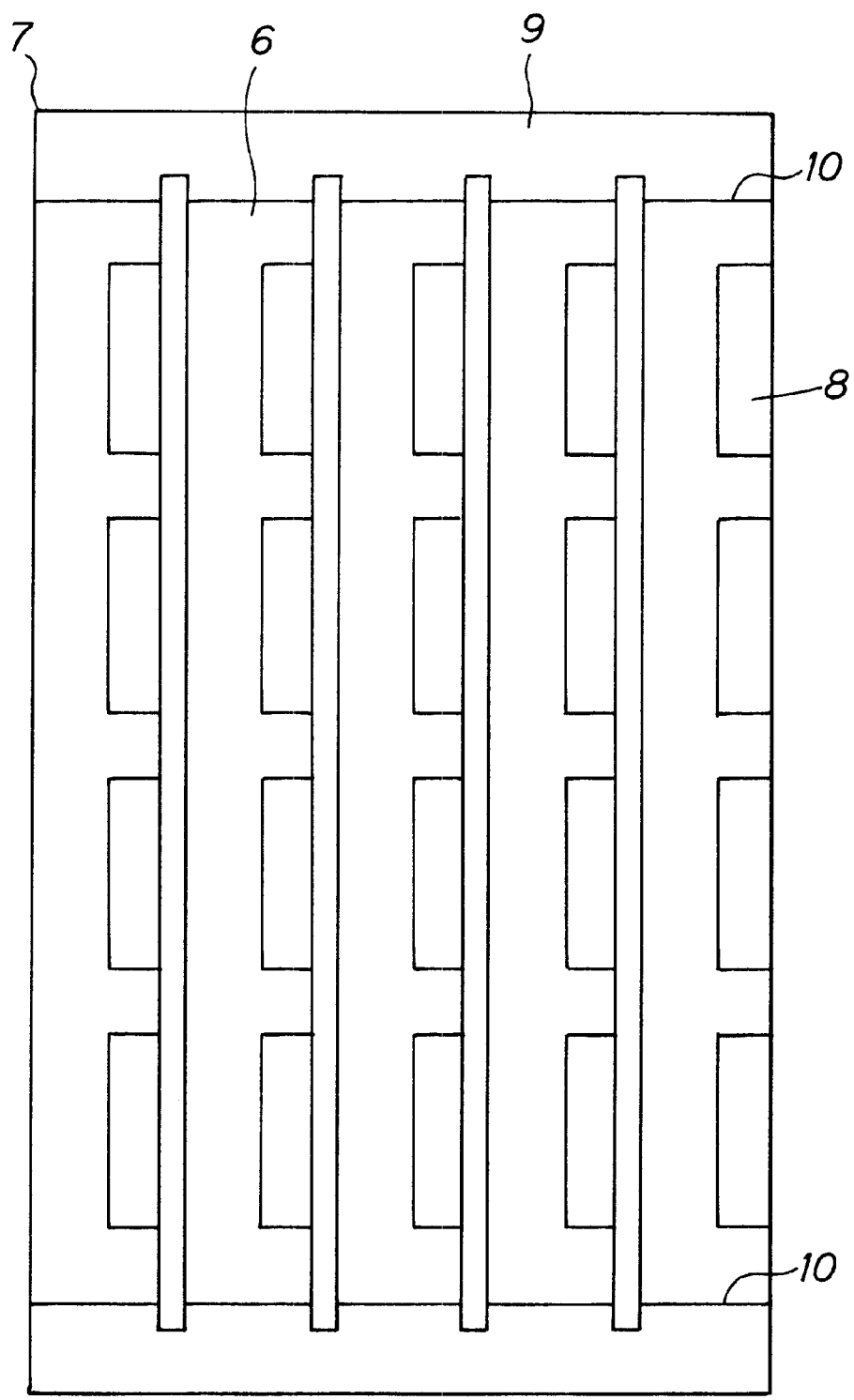
FIG. 6 is a plan view showing a circuit board chain before an adhesive layer is formed in a production method for a circuit board of the invention.
Figure 7:
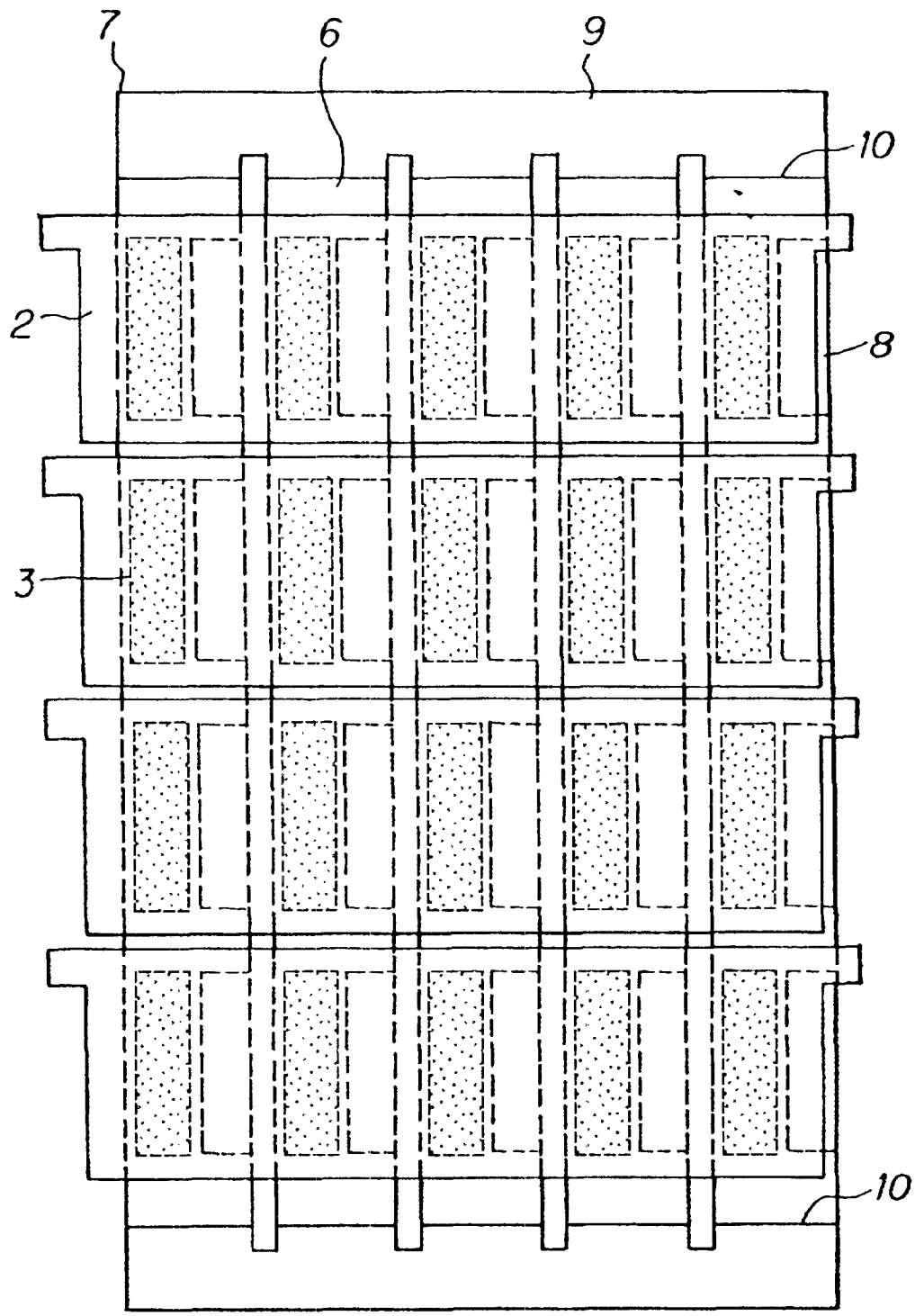
FIG. 7 is a plan view showing a circuit board chain with an adhesive layer and a first separation sheet attached thereon in accordance with a production method for a circuit board of the invention.
Figure 8:
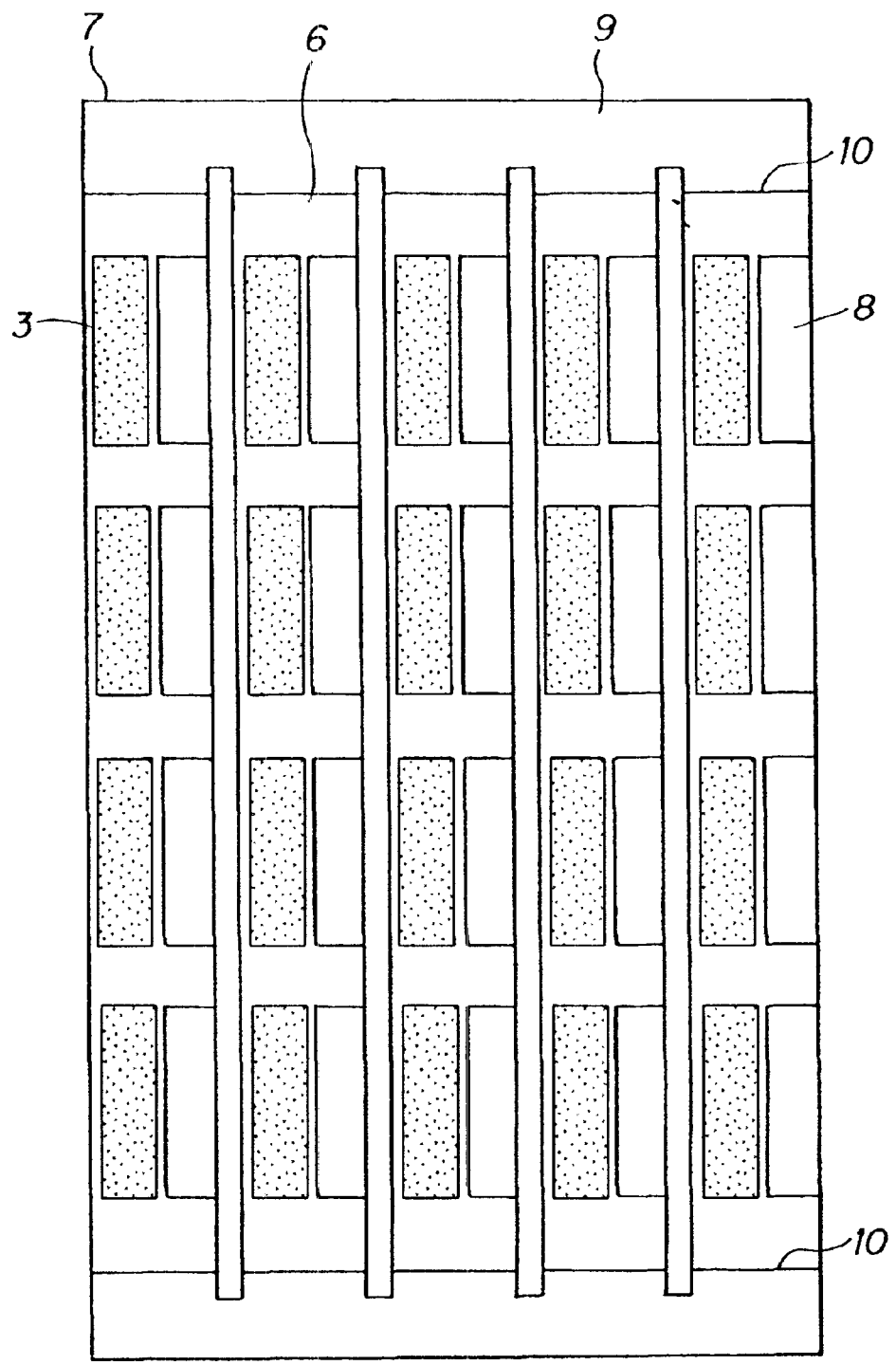
FIG. 8 is a plan view showing a circuit board chain after an adhesive layer was formed in accordance with a production method for a circuit board of the invention.
Figure 9:
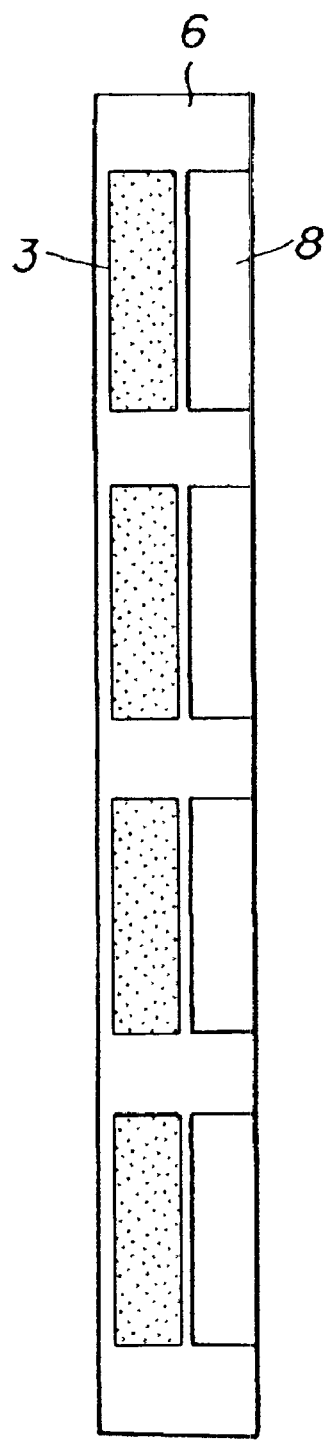
FIG. 9 is a plan view showing a circuit board obtained in a production method for a circuit board of the invention.

Referring to FIGS. 6 to 9, a production method for circuit board 6 of the invention will be described in detail. FIG. 6 is a plan view showing a circuit board chain 7 before adhesive layer 3 is formed in the production method for circuit board 6 of the invention. FIG. 7 is a plan view showing a circuit board chain 7 with adhesive layer 3 and first separation sheet 2 attached thereon in accordance with the production method for circuit board 6 of the invention. FIG. 8 is a plan view showing circuit board chain 7 after adhesive layer 3 was formed in accordance with the production method for circuit board 6 of the invention. FIG. 9 is a plan view showing circuit board 6 obtained in the production method for circuit board 6 of the invention.

As shown in FIG. 6, circuit board chain 7 is composed of a plurality of circuit boards 6 formed with electrode terminals 8, and joint boards 9. Formed at the boundary between circuit boards 6 and joint board 9 is a V-groove 10 for separation. Circuit board chain 7 is made from glass-fiber reinforced epoxy resin, and its manufacturing steps including cream-solder application, mounting of various parts, reflow, examination, etc., can be performed by well-known technologies.

In adhesive lamination 1 of the invention, plural patches of adhesive layer 3 adhered on first separation sheet 2 are obtained by removing first separation sheet 2 from second separation sheet 4. First separation sheet 2 with adhesive layer 3 attached thereon is placed facedown on circuit board 6 side and positioned into a predetermined place avoiding the electronic part-mounted portions, cutouts and holes for screws on circuit board chain 7. In this alignment, separation sheet 2 with adhesive layer 3 attached thereon is attached on circuit board chain 7 by pressing the patches of adhesive layer 3.

In the same manner, a number of first separation sheets 2 with adhesive layer 3 thereon are applied to predetermined positions on circuit board chain 7. This situation is shown in FIG. 7.

Then, first separation sheet 2 is separated from circuit board chain 7 having first separation sheet 2 with adhesive layer 3 attached thereon by picking up the projection by hand, etc., so as to produce circuit board chain 7 with adhesive layer 3 exposed as shown in FIG. 8.

Next, circuit board 6 is broken off from joint boards 9 which adjoin circuits boards 6, at V-grooves 10 so as to obtain circuit board 6 with adhesive layer 3 as shown in FIG. 9.

Figure 10:
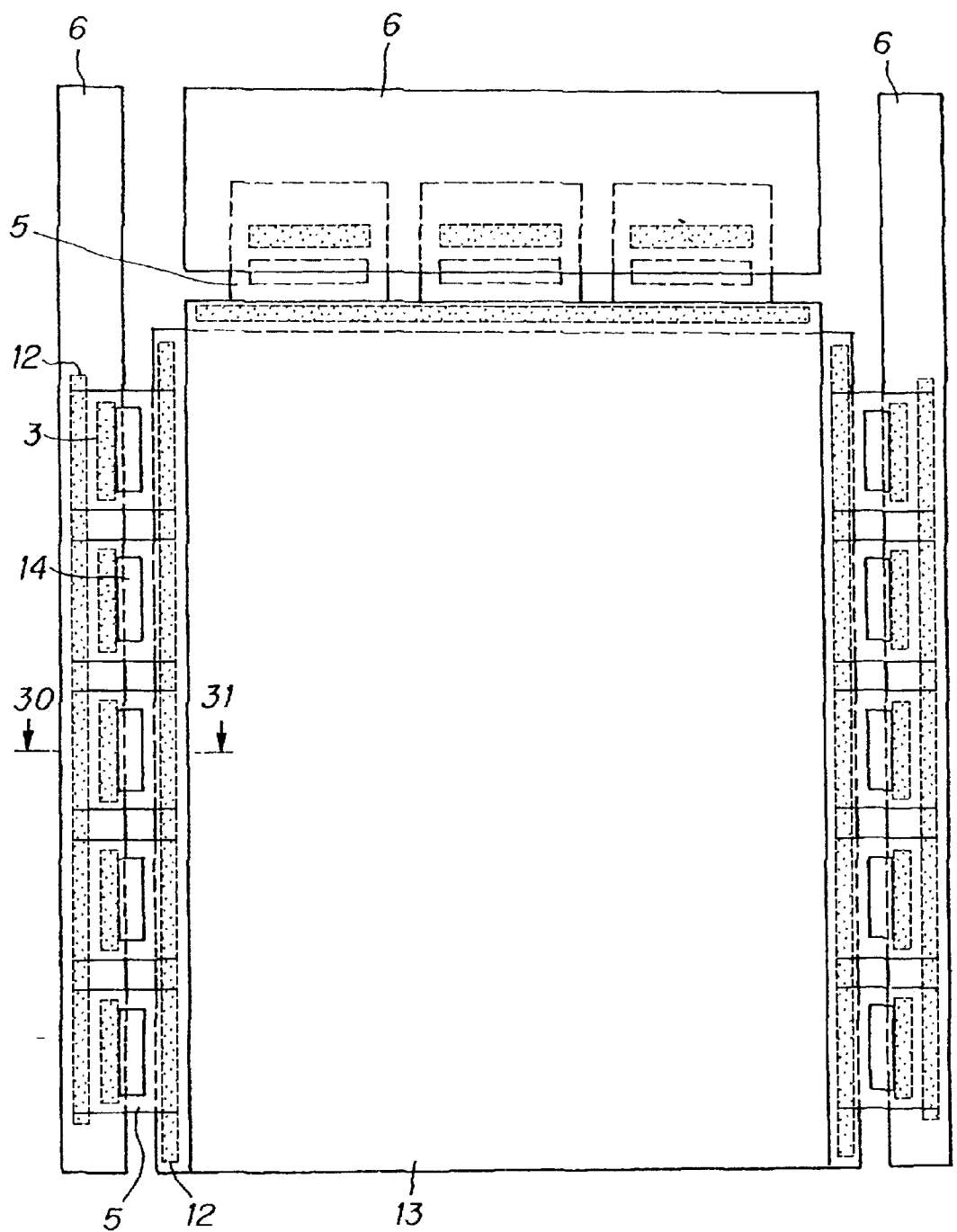
FIG. 10 is a plan view showing a liquid crystal display device in accordance with the invention.
Figure 11:
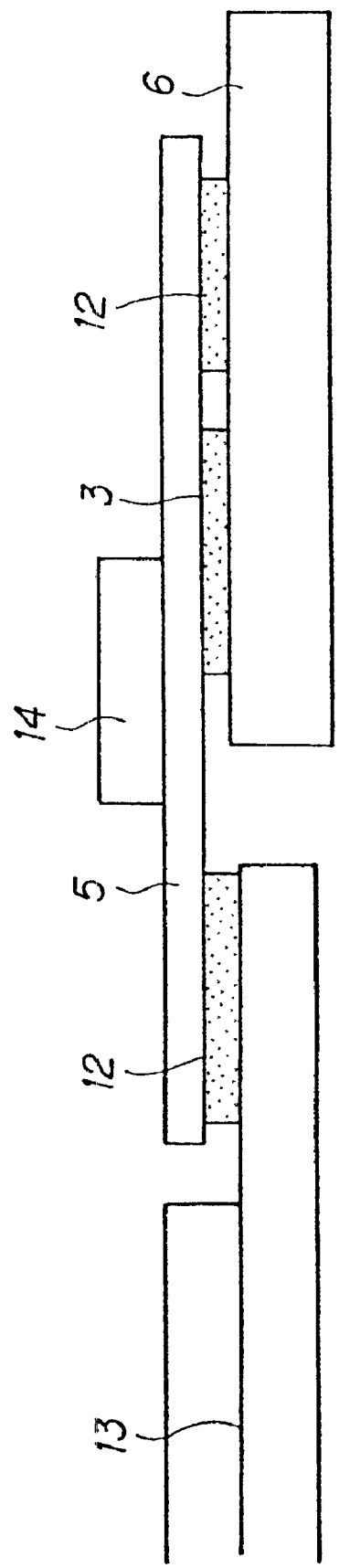
FIG. 11 is a sectional view taken on line 30–31 in FIG. 10.
Figure 12:
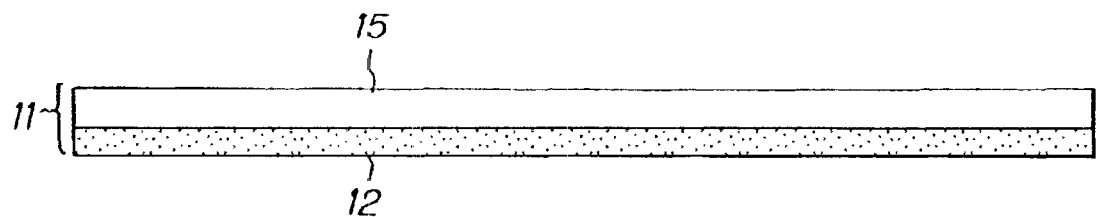
FIG. 12 is a sectional view showing an anisotropically conductive adhesive lamination.
Figure 13:
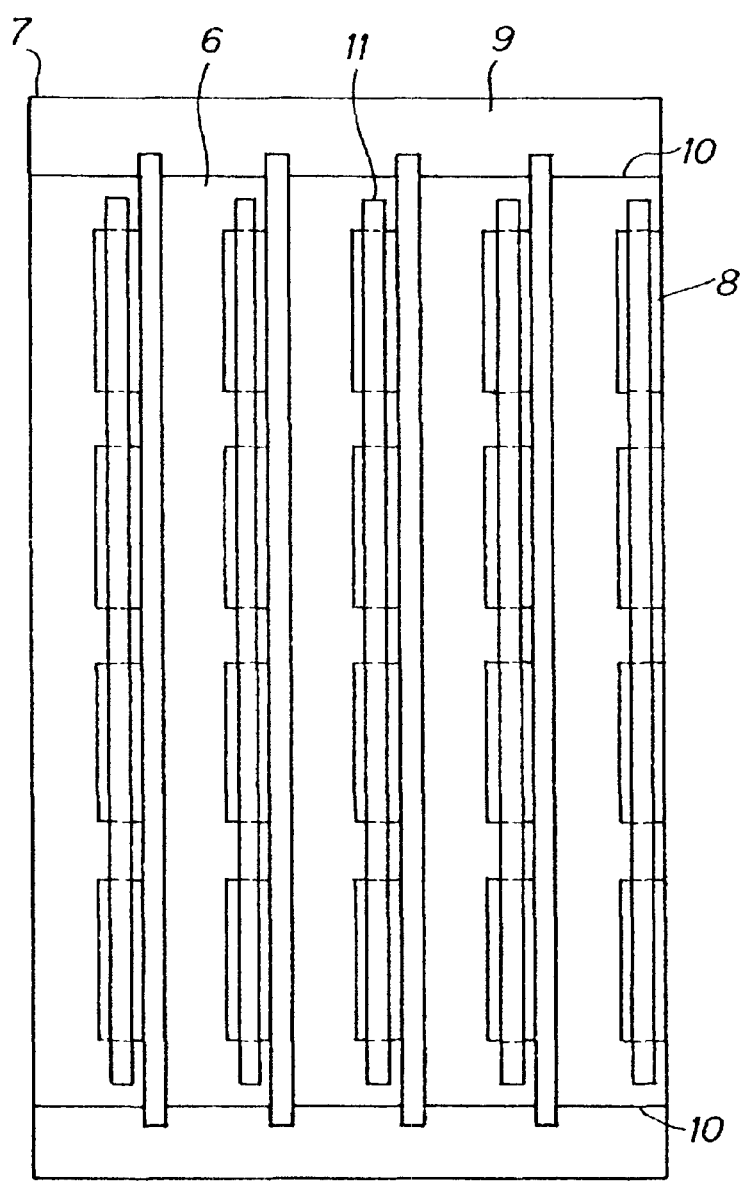
FIG. 13 is a plan view showing a circuit board chain after an anisotropically conductive adhesive layer was formed, in accordance with a production method for a liquid crystal display device of the invention.
Figure 14:
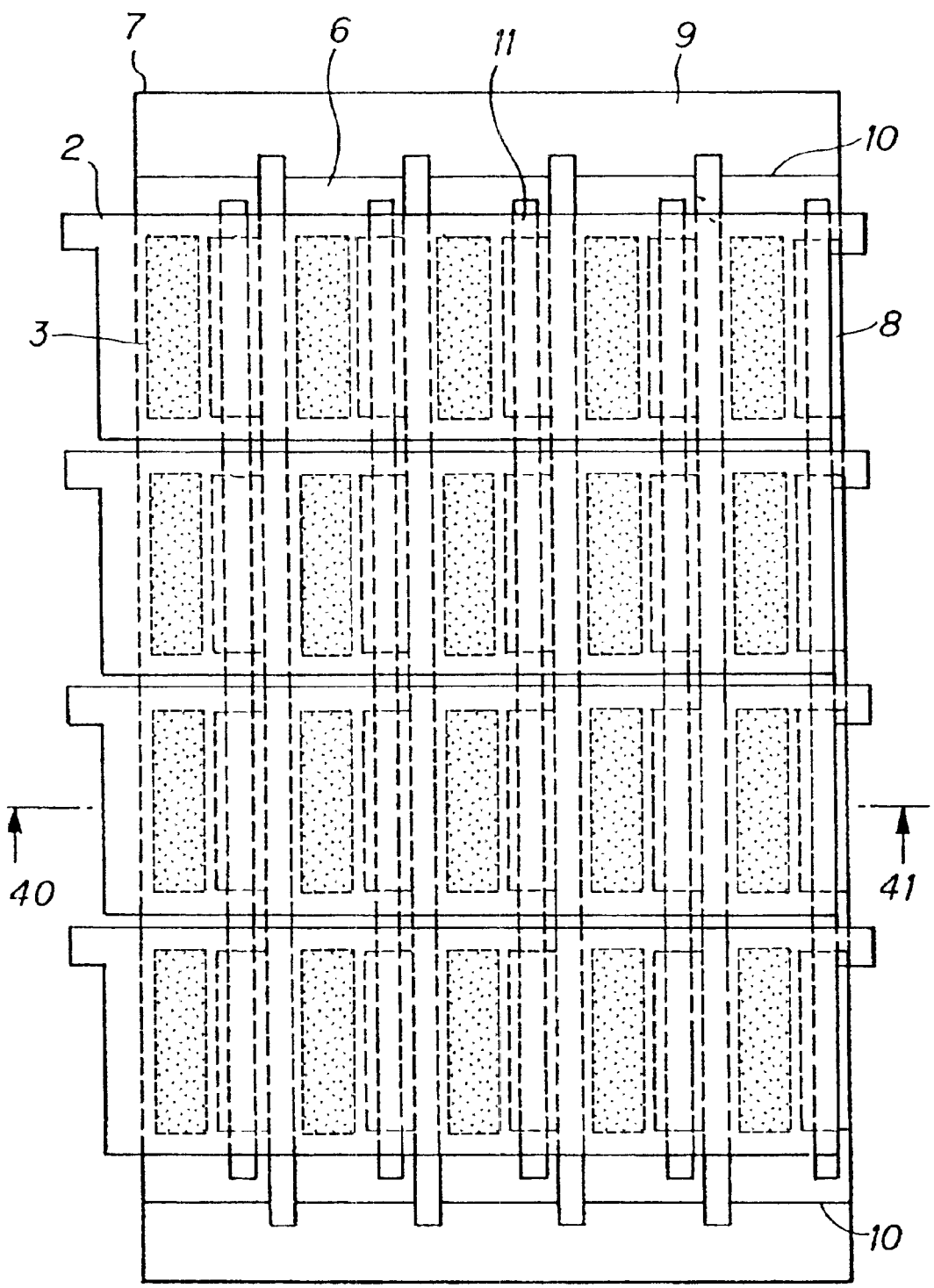
FIG. 14 is a plan view showing a circuit board chain with a dry film, an adhesive layer and a first separation layer attached thereon, in accordance with a production method for a liquid crystal display device of the invention.
Figure 15:
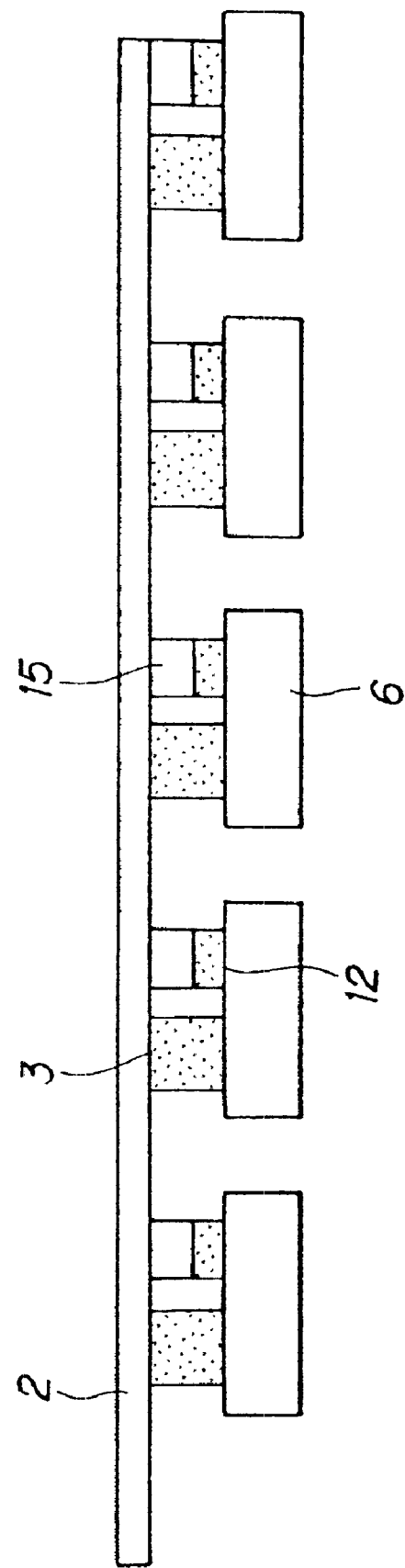
FIG. 15 is a sectional view taken on line 40–41 in FIG. 14.
Figure 16:
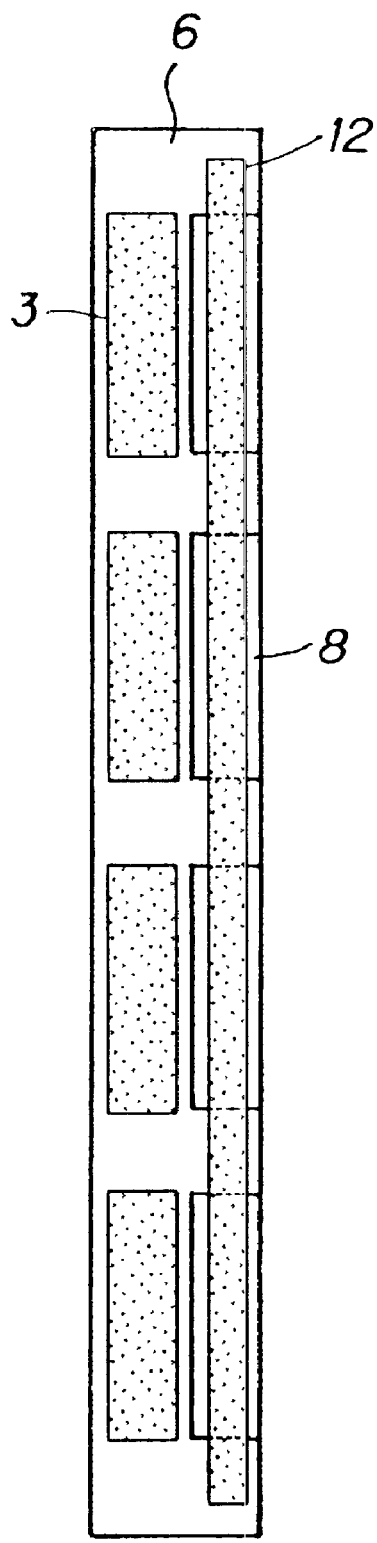
FIG. 16 is a plan view showing a circuit board with an anisotropically conductive adhesive layer and an adhesive layer attached thereon, in accordance with a production method for a liquid crystal display device of the invention.

Referring FIG. 5 and FIGS. 10 through 16, the liquid crystal display device of the invention and the production method therefor will be described in detail. FIG. 10 is a plan view showing a liquid crystal display device in accordance with the invention. FIG. 11 is a sectional view of FIG. 10 taken on line 30–31. FIG. 12 is a sectional view showing an anisotropically conductive adhesive lamination 11. FIG. 13 is a plan view showing a circuit board chain 7 after an anisotropically conductive adhesive layer (a dry film is used in this embodiment) 12 was formed, in accordance with the production method for the liquid crystal display device of the invention. FIG. 14 is a plan view showing circuit board chain 7 with dry film 12, adhesive layer 3 and first separation layer 2 attached thereon, in accordance with the production method for the liquid crystal display device of the invention. FIG. 15 is a sectional view of FIG. 14 taken on line 40–41. FIG. 16 is a plan view showing circuit board 6 with dry film 12 and adhesive layer 3 attached thereon, in accordance with the production method for the liquid crystal display device of the invention.

As shown in FIGS. 10 and 11, the LCD device of the invention is composed of an LCD panel 13, circuit boards 6 obtained by the above production method and TAB films 5.

As shown in FIG. 5, the conditions of the connection between these components are that one patch of adhesive layer 3 is attached to each TAB film 5, and length A of this patch of adhesive layer 3 is equal to the width (the dimension of the short side) of the first separation sheet 2 or less and is approximately equal to length B of the electrode terminal portion.

In this way, adhesive layer 3 is formed corresponding to the layout and size of electrode terminals, so that the electrode terminals of TAB film 5 and electrode terminals 8 of circuit board 6 fit to one another with a uniform gap or uniform strain. This facilities the electrical connection between TAB film 5 and circuit board 6, making it possible to prevent the occurrence of electrical connection defects.

In the first production method for an LCD device of the invention, a plurality of TAB films 5 with LSIs 14 attached thereon are electrically connected to LCD panel 13 by the following manner. Here, TAB film 5 is provided with slits for easy soldering.

An anisotropically conductive adhesive lamination 11 which is formed of a dry film 12 with a protective film 15 laminated as shown in FIG. 12 is put over the electrode terminals of an LCD panel 13, and then anisotropically conductive adhesive lamination 11 is pressed and fixed thereto with a pressure of 5 to 30 Kg/cm$^2$ whilst being heated at a temperature of 60 to 100° C.

After protective film 15 is separated from dry film 12, TAB film 5 is aligned with LCD panel 13. Then, dry film 12 is pressed with a pressure of 25 to 45 Kg/cm$^2$ whilst being heated at a temperature of 155 to 190° C. to establish the electrical connection.

Next, TAB films 5 which were electrically connected with LCD panel 13 are adhered and fixed to circuit board 6 obtained by the aforementioned production method via adhesive layer 3 formed on circuit board 6. Adhesive layer 3 is formed on circuit board 6 so as to avoid cutouts, holes for screws, ceramic capacitors and other electronic parts arranged on circuit board 6.

Thereafter, the electrical connection is performed by soldering using the silts previously formed in TAB film 5 to complete an LCD device.

In the second production method for an LCD device of the invention, a plurality of TAB films 5 with LSIs 14 attached thereon are electrically connected t o LCD panel 13 by laying anisotropically conductive adhesive lamination 11 over the electrode terminals of LCD panel 13 and pressing the lamination 11 with a pressure of 5 to 30 Kg/cm$^2$ whilst heating the lamination 11 at a temperature of 60 to 100 ° C.

After protective film 15 is separated from dry film 12 of anisotropically conductive adhesive lamination 11, TAB film 5 is aligned with LCD panel 13. Then, dry film 12 is pressed with a pressure of 25 to 45 Kg/cm² whilst being heated at a temperature of 155 to 190° C. to establish the electrical connection.

Next, the connection between TAB films 5 and circuit board 6 is performed. In this case, a circuit board 6 which is obtained by the aforementioned production method is used. Adhesive layer 3 is formed on circuit board 6 so as to avoid cutouts, holes for screws, ceramic capacitors and other electronic parts arranged on circuit board 6.

Anisotropically conductive adhesive lamination 11 is laid over electrode terminals 8 of the circuit board 6 by taking advantage of the tackiness of dry film 12 and pressed and fixed thereto with a pressure of 5 to 30 Kg/cm² whilst being heated at 60 to 100° C.

After the removal of protective film 15 from dry film 12, LCD panel 13 is aligned with circuit board 6. With electrode terminals of a number of TAB films 5 laid over electrode terminals 8 of circuit board 6, TAB films 5 are pressed against circuit board 6, to thereby be adhered and fixed to circuit board 6 through adhesive layer 3.

Then, dry film 12 is pressed with a pressure of 25 to 45 Kg/cm² whilst being heated at a temperature of 155 to 225° C. to electrically connect electrode terminals 8 of circuit board 6 with the electrode terminals of TAB films 5, thus completing an LCD device.

In the third production method for an LCD device of the invention, a plurality of TAB films 5 with LSIs 14 attached thereon are electrically connected to LCD panel 13 by laying anisotropically conductive adhesive lamination 11 over the electrode terminals of LCD panel 13 and pressing the lamination 11 with a pressure of 5 to 30 Kg/cm² whilst heating the lamination 11 at a temperature of 60 to 100° C.

After protective film 15 is separated from dry film 12, TAB film 5 is aligned with LCD panel 13. Then, dry film 12 is pressed with a pressure of 25 to 45 Kg/cm² whilst being heated at a temperature of 155 to 190° C. to establish the electrical connection.

Next, TAB films 5 are connected to circuit boards 6. In this case, a circuit board 6 which is obtained by the following production method is used.

As shown in FIG. 13, circuit board chain 7 is composed of a plurality of circuit boards 6 formed with electrode terminals 8, and joint boards 9. Formed at the boundary between circuit board 6 and joint board 9 is a V-groove 10 for separation. Circuit board chain 7 is made from glass-fiber reinforced epoxy resin, and its manufacturing steps including cream-solder application, mounting of various parts, reflow, examination, etc., can be performed by well-known technologies.

First, by utilizing the tacking performance of dry film 12, anisotropically conductive adhesive lamination 11 is adhered to each of circuit boards 6 with its dry film 12 facedown to circuit board 6 side.

Then, anisotropically conductive adhesive lamination 11 is pressed with a pressure of 5 to 30 Km/cm² whilst being heated at 60 to 100° C. so as to enhance the contact force between dry film 12 and circuit board 6. Thus, the lamination is affixed to the circuit boards.

Next, in adhesive lamination 1 of the invention, first separation sheet 2 with plural patches of adhesive layer 3 thereon is obtained by separating first separation sheet 2 together with adhesive layer 3 from second separation sheet 4. First separation sheet 2 with adhesive layer 3 attached thereon is placed facedown on circuit board 6 and positioned at right angles with plural strips of anisotropically conductive adhesive lamination 11 avoiding the electronic part-mounted portions, cutouts and holes for screws on circuit board chain 7. In this arrangement, separation sheet 2 with adhesive layer 3 is attached on circuit board chain 7 by pressing the patches of adhesive layer 3.

In the same manner, a number of first separation sheets 2 with adhesive layer 3 thereon are applied to predetermined positions on circuit board chain 7. This situation is shown in FIGS. 14 and 15.

Then, circuit board 6 is broken off from joint boards 9 which adjoin circuits boards 6, at V-grooves 10, while protective film 15 and first separation sheet 2 are separated from dry film 12 and adhesive layer 3, receptively, so as to obtain circuit board 6 with adhesive layer 3 and dry film 12 exposed, as shown in FIG. 16.

Next, liquid crystal panel 13 is aligned with circuit boards 6, and the electrode terminals of a plurality of TAB films 5 are laid over the electrode terminals 8 of circuit boards 6. In this arrangement, TAB films 5 ale adhered and fixed to circuit boards 6 through adhesive layer 3 by pressing TAB films 5.

Then, dry film 12 is pressed with a pressure of 25 to 45 Kg/cm² whilst being heated at a temperature of 155 to 225 ° C. to electrically connect electrode terminals 8 of circuit board 6 to the electrode terminals of TAB films 5, thus completing an LCD device.

As has been described, in accordance with the adhesive lamination of the invention, the patches of adhesive layer which correspond to predetermined positions of plural circuit boards are provided so that the adhesive layer can be applied across the plural circuit boards. Thus, it becomes possible to perform multiple production of circuit boards with an adhesive layer, therefore it is possible to produce the circuit boards with an adhesive layer at low cost.

Further, the adhesive lamination of the invention is composed of an elongated, rectangular first separation sheet, a second separation sheet and an elongated, rectangular adhesive layer between the first separation sheet and second separation sheet. The first separation sheet is formed with a plurality of patches of the adhesive layer so that the length of each patch of the adhesive layer is arranged approximately parallel to the short side of the first separation sheet. This arrangement facilitates the attachment of the adhesive layer onto the circuit board chain and the separation of the first separation sheet which is adhered to adhesive layer.

In an adhesive lamination of the invention, since the adhering strength between the first separation sheet and the adhesive layer is greater than that between the second separation sheet and the adhesive layer, the second separation sheet can first be removed from the adhesive lamination and then the remaining lamination is pressed with the adhesive layer facedown against the circuit board, thereafter the first separation sheet can be easily removed from the adhesive layer.

In an adhesive lamination of the invention, since a plurality of the first separation sheets are formed on the second separation sheet and the layout of the first separation sheets is repeated or arranged facing each other, it is possible to form many patches of adhesive layer on one adhesive lamination.

In an adhesive lamination of the invention, a plurality of the first separation sheets are formed on the second separation sheet and are shaped in a comb-like form so that a pair of the first separation sheets are laid out mated to one another. Thus, it is possible, to reduce the waste of space and increase the number of the first separation sheets for each second separation sheet compared to cases where other shapes are used.

In an adhesive lamination of the invention, since the patches of the adhesive layer formed on the first separation sheet are arranged at intervals corresponding to that of the circuit boards arranged in the circuit board chain which is formed of a series of circuit boards, this feature facilitates easy application of the adhesive layer to the circuit board chain and easy removal of the first separation sheet from the adhesive layer.

In an adhesive lamination of the invention, since the adhesive layer is formed so that each film, at least having electrodes, corresponds to one patch of the adhesive layer, it is possible to keep an uniform distance between the electrode terminals of the film, at least having electrode, and the corresponding electrode terminals of the circuit board. Thus, it is possible to easily perform the operation for electrical connection by soldering and/or with an anisotropically conductive adhesive as well as to prevent the occurrence of electrical connection defects.

In an adhesive lamination of the invention, since the length of the patch of the adhesive layer is approximately equal to the length of the electrode terminal portion formed on the film, at least having electrodes, stress loads which arise at the electrical contact points between the electrode terminals of the film, at least having electrodes, and the electrode terminals of the circuit board when the portion is tensioned, become substantially even for each contact point between the electrode terminals. Consequently, it is possible to prevent the occurrence of electrical connection defects such as disconnection due to stress loads etc. during the manufacture of the LCD devices.

The production method for a circuit, board of the invention is the one for producing the circuit board having an adhesive layer and includes the steps of forming patches of the adhesive layer which correspond to predetermined positions across a plurality of circuit boards arranged in a circuit board chain which is formed of a series of the circuit boards; and breaking the circuit board chain with the adhesive layer attached thereon, into separated pieces of circuit boards. Therefore, it is possible to improve the efficiency of the operation of forming an adhesive layer onto the circuit boards and thus reduce the cost for the manufacture.

In accordance with an LCD device of the invention, a plurality of films, at least having electrodes, and connected with an LCD panel is adhered and fixed to a circuit board with an adhesive layer, and the electrode terminals of the film, at least having electrodes, are electrically connected to the electrode terminals of the circuit board. In such an LCD device, a number of patches. of the adhesive layer are formed corresponding to predetermined positions across a series of circuit boards. Therefore, it is possible to improve the efficiency of the operation of forming an adhesive layer onto the circuit boards and thus reduce the cost for the manufacture. Further, it is easily possible to reduce the width of the frame of the display window of the LCD device and improve the reliability of the electrical connection.

A production method for an LCD device of the invention is of electrically connecting a plurality of films, at least having electrodes, and connected with an VCD panel, to a circuit board, and includes the steps of forming patches of an adhesive layer which correspond to predetermined positions across a plurality of circuit boards arranged in a circuit board chain which is formed of a series of circuit boards; breaking the circuit board chain with the adhesive layer attached thereon, into separated pieces of circuit boards; adhering and fixing the films, at least having electrodes, to the circuit board with an adhesive layer via the adhesive layer; and electrically connecting the films, at least having electrodes, to the circuit board by joining at the electrode terminals on both sides with solder. Therefore, it is easily possible to reduce the width of the frame of the display window of the LCD device and improve the reliability of the electrical connection.

Another production method for an LCD device of the invention is the one for electrically connecting a plurality of films, at least having electrodes, and connected with an LCD panel, to a circuit board, and includes the steps of forming patches of the adhesive layer which correspond to predetermined positions across a plurality of circuit boards arranged in a circuit board chain which is formed of a series of circuit boards; breaking the circuit board chain with the adhesive layer attached thereon, into separated pieces of circuit boards; forming an anisotropically conductive adhesive layer on the circuit board chain with the adhesive layer attached thereon; adhering and fixing the films, at least having electrodes, to the circuit board with the adhesive layer and the anisotropically conductive adhesive layer attached thereon via the adhesive layer; and electrically connecting the films, at least having electrodes, to the circuit board by pressing and heating the anisotropically conductive adhesive layer. Therefore, it is easily possible to reduce the width of the frame of the display window of the LCD device and improve the reliability of the electrical connection.

A further production method for an LCD device of the invention is the one for electrically connecting a plurality of films, at least having electrodes, and connected with an LCD panel, with a circuit board, and includes the steps of forming an anisotropically conductive adhesive layer on a circuit board chain which is formed of a series of the circuit boards; forming patches of an adhesive layer which correspond to predetermined positions across a plurality of circuit boards arranged in the circuit board chain with the anisotropically conductive adhesive layer attached thereon; breaking the circuit board chain with the anisotropically conductive layer and the adhesive layer attached thereon, into separated pieces of circuit boards; adhering and fixing the films, at least having electrodes, to the circuit board with the adhesive layer and the anisotropically conductive adhesive layer attached thereon, via the adhesive layer; and electrically connecting the films, at least having electrodes, to the circuit board by pressing,and heating the anisotropically conductive adhesive layer. In this way, it becomes possible to effectively form an a isotropically conductive adhesive layer and an adhesive layer. Also, it is easily possible to reduce the width of the frame of the display window of the LCD device and improve the reliability of the electrical connection.

What is claimed is:

1. An adhesive lamination for application across a circuit board chain comprising:

a multiple number of first separation sheets of an approximately rectangular shape;

a plurality of rectangular shaped patches of an adhesive layer disposed on each of the first separation sheets at evenly spaced intervals such that the long sides of the plurality of patches are approximately parallel with the short sides of the first separation sheets;

a second separation sheet positioned such that the plurality of rectangular shaped patches are disposed between the plurality of first separation sheets and the second separation sheet;

the patches being provided in numbers and being arranged at intervals such that, when each of the first separation sheets is applied across a circuit board chain, in which a plurality of circuit boards of an elongated rectangular shape are separably joined along their long sides at said evenly spaced intervals, and the first separation sheets are applied in a direction perpendicular to the long sides of the plurality of circuit boards, the plurality of patches from each of the first separation sheets are distributed with one patch per circuit board in the circuit board chain.

2. An adhesive lamination according to claim 1, wherein the adhering strength between said first separation sheet and said adhesive layer is greater than that between said second separation sheet and said adhesive layer.

3. An adhesive lamination according to claim 1 or 2, wherein the plurality of said first separation sheets are provided on said second separation sheet, and the first separation sheets are repeatedly laid out or arranged in a row with their long sides parallel with each other.

4. An adhesive lamination according to claim 1 or 2, wherein a plurality of said first separation sheets are provided on said second separation sheet, and each of the first separation sheets is shaped in a comb-like form so that a pair of said first separation sheets are laid out mated to one another.

5. An adhesive lamination according to claim 1 or 2, wherein, the patch on each circuit board corresponds to an electrode terminal on a subsequently bonded film, whereby the circuit boards in the circuit board chain may be separated after distribution of the patches to the circuit board chain and prior to application of the film to each circuit board.

6. An adhesive lamination according to claim 5, wherein the length of the patches of said adhesive layer is approximately equal to the length of the corresponding electrode terminal on the film.

7. An adhesive lamination according to claim 1, wherein the first separation sheets are transparent.

8. An adhesive lamination according to claim 1, wherein the patches of an adhesive layer are colored.

9. An adhesive lamination according to claim 1, wherein the second separation sheet is opaque.

10. The adhesive lamination of claim 1, wherein the long sides of the multiple number of first separation sheets are approximately straight.

11. An adhesive lamination comprising:

a multiple number of first separation sheets of an approximately rectangular shape;

a plurality of rectangular shaped patches of an adhesive layer disposed on each of the first separation sheets at evenly spaced intervals such that the long sides of the plurality of patches are approximately parallel with the short sides of the first separation sheets;

a second separation sheet positioned such that the plurality of rectangular shaped patches are disposed between the plurality of first separation sheets-and the second separation sheet;

whereby application of the first separation sheet across a circuit board chain, comprising a plurality of circuit boards of an elongated rectangular shape separably joined along their long sides at said evenly spaced intervals, distributes the plurality of patches to the plurality of circuit boards, and whereby after application of the patches to the circuit boards, the circuit boards in the circuit board chain are separated to form a plurality of individual circuit boards with at least one patch disposed thereon in a position such that when a film with at least one electrode terminal disposed thereon is applied to each individual circuit board, the patch corresponds to the electrode terminal, the plurality of rectangular shaped patches spaced from each other at intervals such that application of the first separation sheet across a circuit board chain distributes one rectangular shaped patch to each circuit board in the circuit board chain.

12. The adhesive lamination of claim 11, wherein the length of the patch of said adhesive layer is approximately equal to the length of the corresponding electrode terminal on the film.

* * * * *